(12) United States Patent
Kim et al.

(10) Patent No.: US 12,476,227 B2
(45) Date of Patent: Nov. 18, 2025

(54) SOCKET TO SUPPORT HIGH PERFORMANCE MULTI-DIE ASICs

(71) Applicant: Google LLC, Mountain View, CA (US)

(72) Inventors: Nam Hoon Kim, San Jose, CA (US); Jaesik Lee, San Jose, CA (US); Woon-Seong Kwon, Santa Clara, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 456 days.

(21) Appl. No.: 17/993,240

(22) Filed: Nov. 23, 2022

(65) Prior Publication Data

US 2024/0096859 A1    Mar. 21, 2024

Related U.S. Application Data

(60) Provisional application No. 63/399,300, filed on Aug. 19, 2022.

(51) Int. Cl.
*H01L 25/10* (2006.01)
*H01L 23/498* (2006.01)
(Continued)

(52) U.S. Cl.
CPC ...... *H01L 25/105* (2013.01); *H01L 23/49816* (2013.01); *H01L 23/5383* (2013.01); *H01L 23/5386* (2013.01); *H01L 25/50* (2013.01)

(58) Field of Classification Search
CPC ............. H01L 25/105; H01L 23/49816; H01L 23/5383
See application file for complete search history.

(56) References Cited

U.S. PATENT DOCUMENTS 5,702,256 A    12/1997  Severn
6,916,181 B2    7/2005  Brown et al.
(Continued)

FOREIGN PATENT DOCUMENTS

CN    1508912 B    6/2010
EP    3971960 A1   3/2022
(Continued)

OTHER PUBLICATIONS

Extended European Search Report for European Patent Application No. 23156832.0 dated Sep. 1, 2023. 8 pages.

*Primary Examiner* — Thao P Le
(74) *Attorney, Agent, or Firm* — Lerner David LLP

(57) ABSTRACT

A microelectronic system may include a microelectronic component having electrically conductive elements exposed at a first surface thereof, a socket mounted to a first surface of the microelectronic component and including a substrate embedded therein, one or more microelectronic elements each having active semiconductor devices therein and each having element contacts exposed at a front face thereof, and a plurality of socket pins mounted to and extending above the substrate, the socket pins being ground shielded coaxial socket pins. The one or more microelectronic elements may be disposed at least partially within a recess defined within the socket. The socket may have a land grid array comprising top surfaces of the plurality of the socket pins or electrically conductive pads mounted to corresponding ones of the socket pins, and the element contacts of the one or more microelectronic elements may be pressed into contact with the land grid array.

20 Claims, 3 Drawing Sheets

(51) Int. Cl.
*H01L 23/538* (2006.01)
*H01L 25/00* (2006.01)

(56) References Cited

U.S. PATENT DOCUMENTS

| | | | |
|---|---|---|---|
| 6,932,618 B1 | 8/2005 | Nelson | |
| 7,070,419 B2 | 7/2006 | Brown et al. | |
| 7,113,408 B2 | 9/2006 | Brown et al. | |
| 7,149,095 B2* | 12/2006 | Warner | H05K 1/189 |
| | | | 361/767 |
| 7,628,617 B2 | 12/2009 | Brown et al. | |
| 7,772,860 B2 | 8/2010 | Chong et al. | |
| 8,116,097 B2 | 2/2012 | Love et al. | |
| 8,212,580 B2 | 7/2012 | Izadian | |
| 8,786,069 B1* | 7/2014 | Haba | G11C 5/063 |
| | | | 257/723 |
| 9,276,339 B2 | 3/2016 | Rathburn | |
| 9,490,560 B2 | 11/2016 | Chawla et al. | |
| 9,613,841 B2 | 4/2017 | Rathburn | |
| 10,879,638 B2* | 12/2020 | Mason | H01R 43/0256 |
| 2004/0185714 A1 | 9/2004 | Figueroa et al. | |
| 2005/0120553 A1 | 6/2005 | Brown et al. | |
| 2012/0013028 A1* | 1/2012 | Mohammed | H01L 25/105 |
| | | | 257/777 |
| 2013/0100616 A1* | 4/2013 | Zohni | H01L 25/105 |
| | | | 361/728 |
| 2015/0004813 A1* | 1/2015 | Heppner | H01R 43/24 |
| | | | 264/129 |
| 2017/0077016 A1* | 3/2017 | Prabhu | H01L 25/105 |
| 2019/0385979 A1 | 12/2019 | Rosch et al. | |
| 2022/0183177 A1 | 6/2022 | Zhang et al. | |

FOREIGN PATENT DOCUMENTS

| | | |
|---|---|---|
| JP | 2006004932 A | 1/2006 |
| JP | 2014146504 A | 8/2014 |
| KR | 101789382 B1 | 10/2017 |
| TW | I240468 B | 9/2005 |

* cited by examiner

SOCKET TO SUPPORT HIGH PERFORMANCE MULTI-DIE ASICs

CROSS-REFERENCE TO RELATED APPLICATIONS

This application claims the benefit of the filing date of U.S. Provisional Patent Application No. 63/399,300 filed Aug. 19, 2022, the disclosure of which is hereby incorporated herein by reference.

BACKGROUND

Semiconductor die and package sizes can vary, and assembly yield loss and long-term reliability issues with conventional BGA (ball grid array) packages could impact the total cost of a computer system. Due to signal and power integrity concerns, BGA packages are generally used to mount next generation ASICs including CPUs and TPUs. However, BGA packages cannot be easily replaced when they fail, due to the use of mounting of the packages directly to circuit panels with conductive masses such as solder.

LGA (land grid array) socket solutions are more easily replaceable than BGA systems. However, existing LGA socket solutions cannot support high-speed I/O memory and high-power devices. Furthermore, existing LGA/socket systems may have signal integrity issues, such as reflection loss due to impedance discontinuity and/or high crosstalk, due to a difficulty in shielding the signal pins. Existing LGA systems may also have power and power integrity issues, such as power loss due to high pin contact resistance and/or a large signal to noise ratio due to high pin inductance. Also, existing LGA socket solutions cannot support multi-dies or packages, since such solutions have a one-to-one package/socket connection.

BRIEF SUMMARY

One aspect of the disclosure provides a microelectronic system. The microelectronic system may include a microelectronic component having electrically conductive elements exposed at a first surface thereof, and a socket mounted to a first surface of the microelectronic component, the socket including a substrate embedded therein, the socket defining a recess therein, a first surface of the substrate facing the first surface of the microelectronic component. The microelectronic system may include one or more microelectronic elements each having active semiconductor devices therein and each having element contacts exposed at a front face thereof, the one or more microelectronic elements being disposed at least partially within the recess of the socket.

The microelectronic system may include a plurality of socket pins mounted to and extending above a second surface of the substrate, the socket pins being ground shielded coaxial socket pins, each socket pin having an inner pin configured to conduct electrical signals between the substrate and one of the microelectronic elements and an outer shield extending around the inner pin and configured to be electrically connected to a ground potential. The socket may have a land grid array comprising top surfaces of the plurality of the socket pins or electrically conductive pads mounted to corresponding ones of the socket pins, and the element contacts of the one or more microelectronic elements may be pressed into contact with the land grid array.

The socket may be mounted to the microelectronic component via ball-grid array connections that include electrically conductive masses extending between electrically conductive pads exposed at the first surface of the substrate and the electrically conductive elements exposed at the first surface of the microelectronic component. The substrate may have electrically conductive wires therein electrically connected to the plurality of socket pins and configured to provide communication between the one or more microelectronic elements. The one or more microelectronic elements may be four microelectronic elements. The microelectronic system may include one or more capacitors disposed within the socket adjacent to one or more of the microelectronic elements.

The one or more microelectronic elements may be packaged together in a single wafer-level microelectronic package. The plurality of socket pins may have a minimum pitch between adjacent ones of the socket pins of about 300 microns to 1 mm. The substrate may include one or more redistribution layers to fan out a smaller minimum pitch between adjacent ones of the socket pins to a larger minimum pitch between adjacent ones of electrically conductive pads exposed at the first surface of the substrate. Each socket pin may have an insulator extending between the inner pin and the outer shield thereof, the insulator electrically isolating the inner pin from the outer shield. The insulator may be, for example, air or another material.

The socket may include one or more of clamps or alignment guides configured to fix the microelectronic elements within the recess. An electrical connection between the land grid array and the element contacts of the one or more microelectronic elements may be devoid of conductive masses. Each of the one or more microelectronic elements may have an integrated voltage regulator therein. The microelectronic system may include one or more discrete voltage regulators each mounted to the land grid array or the substrate.

Another aspect of the disclosure provides for a method of assembling a microelectronic system. The method may include providing a microelectronic component having electrically conductive elements exposed at a first surface thereof and mounting a socket to the first surface of the microelectronic component, the socket including a substrate embedded therein, the socket defining a recess therein, a first surface of the substrate facing the first surface of the microelectronic component. The method may include positioning one or more microelectronic elements at least partially within the recess of the socket, each of the one or more microelectronic elements having active semiconductor devices therein and each having element contacts exposed at a front face thereof. The method may include clamping the one or more microelectronic elements into the socket, thereby pressing the element contacts of the one or more microelectronic elements into contact with a land grid array of the socket.

The land grid array of the socket may include top surfaces of a plurality of socket pins or electrically conductive pads mounted to corresponding ones of the socket pins. The plurality of socket pins may be mounted to and may extend above a second surface of the substrate. The socket pins may be ground shielded coaxial socket pins. Each socket pin may have an inner pin configured to conduct electrical signals between the substrate and one of the microelectronic elements and an outer shield extending around the inner pin and configured to be electrically connected to a ground potential.

The socket may be mounted to the microelectronic component via ball-grid array connections that include electrically conductive masses extending between electrically conductive pads exposed at the first surface of the substrate and the electrically conductive elements exposed at the first surface of the microelectronic component. The clamping may be performed by one or more of clamps or alignment guides that fix the one or more microelectronic elements within the recess. Each socket pin may have an insulator extending between the inner pin and the outer shield thereof. The insulator may electrically isolate the inner pin from the outer shield. Each of the one or more microelectronic elements may have an integrated voltage regulator therein.

DETAILED DESCRIPTION

The systems of the present disclosure implement a land grid array (LGA) with a socket that will enable easy swapping, which can improve long term sustainability of devices that incorporate the system. The new socket concept with improved signal/power integrity and multiple dies or packages may enable an improvement in total cost of ownership compared to conventional systems. The system enables easy swapping of electrically faulty chips (intermittent correctable and permanent uncorrectable errors) for both processors and memory, and/or easy upgrading of dies or packages.

The system permits a signal integrity improvement over conventional LGA/socket systems due to a coaxial pin design, that improves per-pin crosstalk and impedance discontinuity. The system also may provide a power integrity improvement due to inclusion of a low contact resistance pin, and an integrated voltage regulator (IVR) die to reduce per pin current. The IVR may be a voltage regulator which has higher switching frequency and bandwidth as compared to conventional on-board voltage regulators.

The systems of the present disclosure include a socket structure for improved signal integrity and multiple die or package (wafer level fan-out chip scale package) configurations. The socket has an embedded substrate or interposer to provide a chip-to-chip communication channel and a BGA connection to another electronic component such as a motherboard. The inclusion of ground shielded coaxial socket pins can solve the signal integrity problems caused by common socket pins, such as impedance discontinuity and crosstalk.

One example of the present disclosure includes dies with integrated voltage regulators (IVRs) for improved power integrity, which can solve the power or power integrity issue caused by high socket pin inductance and contact resistance. Since an IVR input voltage is high (e.g., 5V), the current requirement per pin is much less. Therefore, the power loss from the socket pins will be dramatically reduced. An IVR system has a much higher loop bandwidth than a conventional system which can eliminate most of the need for capacitors in the system.

Figure 1:
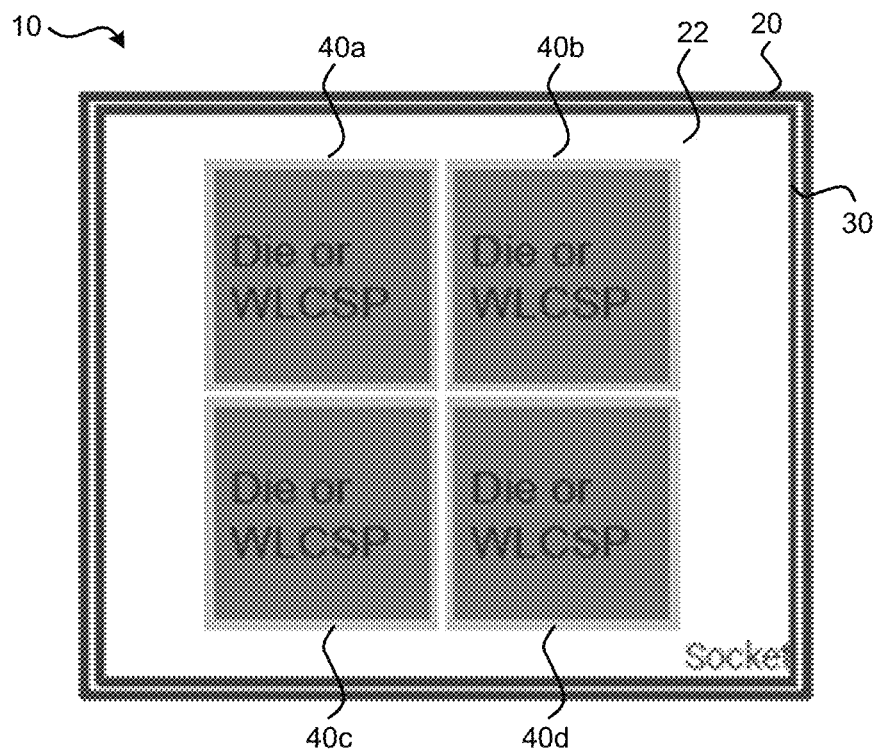
FIG. 1 shows a top plan view of a microelectronic system having a socket thereon, in accordance with aspects of the disclosure.
Figure 2:
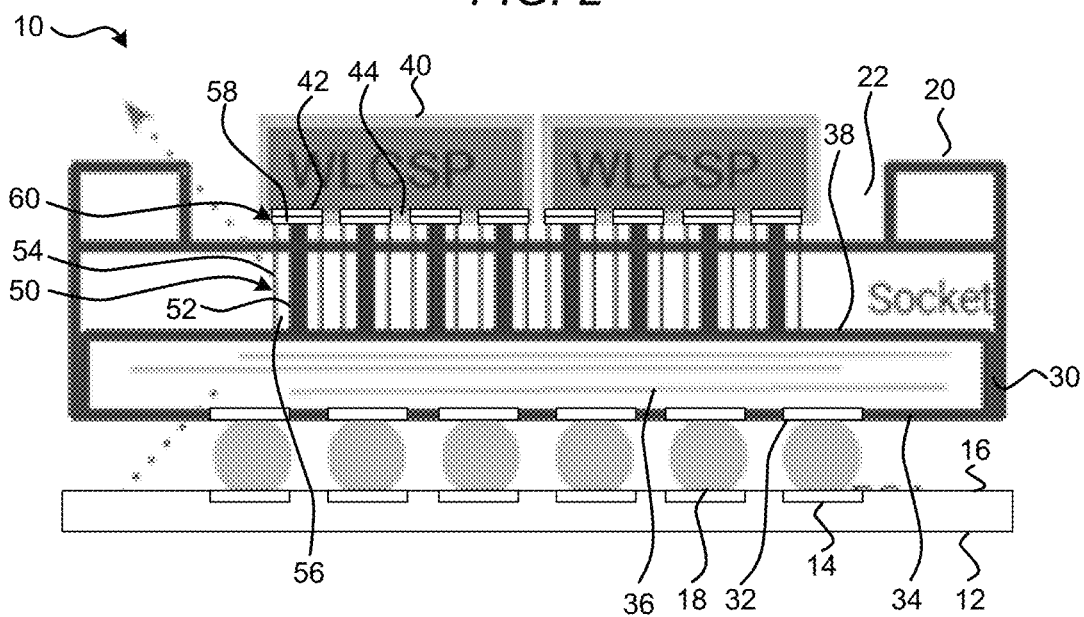
FIG. 2 shows a sectional view of the microelectronic system of FIG. 1.
Figure 3:
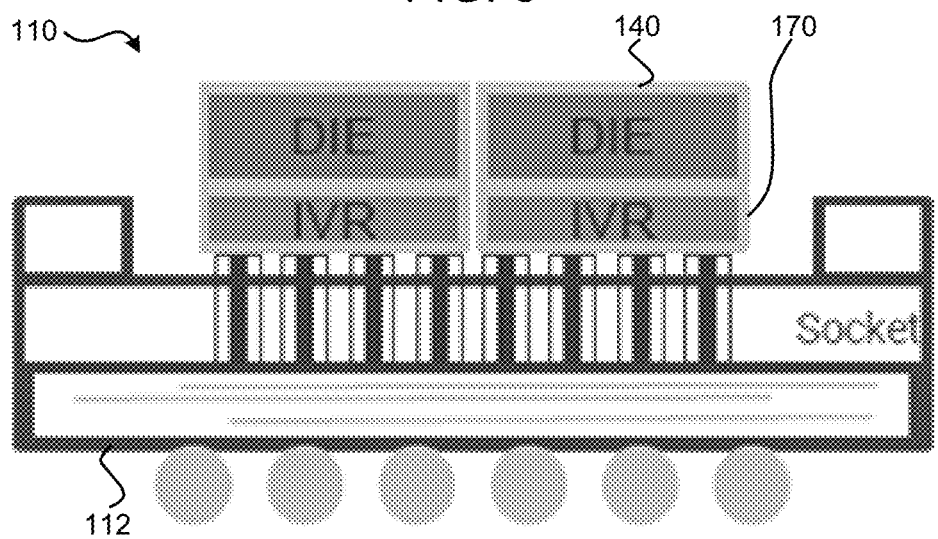
FIG. 3 shows a sectional view of a microelectronic system having a socket thereon, in accordance with aspects of the disclosure.

Referring to FIGS. 1-3, an example microelectronic system 10 includes a socket 20 mounted to a microelectronic component 12, such as a motherboard. The socket 20 may be mounted to electrically conductive pads 14 exposed at a first surface 16 of the microelectronic component 12 via ball-grid array (BGA) connections, which may include electrically conductive masses 18, such as solder balls. The conductive masses 18 and all other conductive masses described herein may be microbumps having a minimum pitch between adjacent microbumps of about 40-50 microns. In some examples, the minimum pitch between adjacent ones of the conductive masses 18 may be about 1 mm.

The socket 20 may include a substrate 30 embedded therein that has electrically conductive pads 32 exposed at a first surface 34 thereof. The electrically conducive pads 32 may be connected to the electrically conductive masses 18, thereby providing electrical connections between the socket 20 and the microelectronic component 12.

The substrate 30 may be a dielectric element such as an FR-4 (glass-reinforced epoxy resin laminate) circuit panel, for example. The substrate 30 may alternatively be made of or may include another dielectric material such as glass or epoxy, or the substrate may be made of or include a semiconductor material such as silicon, germanium, or gallium arsenide.

The system 10 may include one or more microelectronic elements 40, shown in FIGS. 1 and 2 as microelectronic elements 40a, 40b, 40c, and 40d. The microelectronic elements 40 may each include a die or a wafer level chip scale package (WLCSP), or similar packaged part. The microelectronic elements 40 may each have active semiconductor devices therein and may each have element contacts 42 exposed at a front face 44 thereof. Each microelectronic element 40 may include one or more memory, such as dynamic random access memory (DRAM), or application specific integrated circuits (ASICs) therein. In some examples, the microelectronic elements 40 may each be processors such as CPUs or GPU machine learning processors, that together are multiple-core processors. In such examples, the system 10 may provide a shorter electrical communication path between the microelectronic elements 40 compared to conventional solutions, thereby providing a performance improvement. The substrate 30 may have electrically conductive wires 36 therein configured to provide communication between the microelectronic elements 40. Each microelectronic element 40 may have a semiconductor substrate and dielectric passivation layers overlying top and bottom major planar surfaces thereof, for example.

FIG. 1 shows four microelectronic elements 40a through 40d, but in other examples the system 10 may include other numbers of microelectronic elements 40, such as one, two, three, six, eight, ten, twelve, sixteen, or thirty-two, among others. FIG. 1 shows the four microelectronic elements 40 in a two-by-two square arrangement, but in other examples, that need not be the case. For examples, the microelectronic elements 40 may be arranged in a single row, four equal rows, eight equal rows, or rows with an unequal number of microelectronic elements, among others. In other examples, the arrangement of microelectronic elements 40 may include one or more capacitors adjacent to one or more of the microelectronic elements. In some examples, the system 10 may include some or all of the microelectronic elements 40a through 40d packaged together in a single wafer-level microelectronic package.

The system 10 may include a plurality of socket pins 50 mounted to and extending above a second surface 38 of the substrate 30. The socket pins 50 may be electrically connected to the conductive wires 36. The socket pins 50 may have a minimum pitch between adjacent ones of the socket pins of about 300 microns to 1 mm. The substrate 30 may include one or more redistribution layers (RDLs) to fan out a smaller minimum pitch between adjacent ones of the socket pins 50 to a larger minimum pitch between adjacent ones of the conductive masses 18 or between adjacent ones of the electrically conductive pads 32.

The socket pins 50 may be ground shielded coaxial socket pins. Each socket pin 50 may have an inner pin 52 configured to conduct electrical signals between the substrate 30 and one of the microelectronic elements 40 and an outer shield 54 extending around the inner pin and configured to be electrically connected to a ground potential. Each outer shield 54 may be cylindrical in shape. While in some examples the outer shield 54 may be substantially equally spaced apart from a corresponding inner pin 52 disposed therein, in other examples the spacing may vary. The ground shielded coaxial socket pins 50 may solve the signal integrity problems of conventional socket pins, such as impedance discontinuity and crosstalk. Each socket pin 50 may have an insulator 56 extending between the inner pin 52 and the outer shield 54. The insulator 56 may electrically isolate the inner pin 52 from the outer shield 54 and may be air or a dielectric material, among others.

The system 10 may include a land grid array (LGA) 60 comprising electrically conductive pads 58. Each electrically conductive pad 58 may be mounted to a corresponding one of the plurality of socket pins 50. In some examples, the electrically conductive pads 58 may be omitted, and top surfaces of the socket pins 50 may together comprise the LGA 60. The LGA 60 may have an arrangement of socket pins 50, such as a first number of pins extending along a first direction and a second number of pins extending along a second direction.

The socket 20 may be configured to at least partially receive one or more microelectronic elements 40 therein in a recess 22 defined within the socket. The socket may include one or more clamps and/or alignment guides to fix the microelectronic elements 40 within the recess 22, with the element contacts 42 of the microelectronic elements being pressed into contact with the LGA 60 (the electrically conductive pads 58 or the top surfaces of the socket pins 50). The LGA electrical connection between the microelectronic elements 40 and the socket pins 50 can be done with or without the use of a conductive mass, such as solder.

Now referring to FIG. 3, an example microelectronic system 110 is shown that is a variation of the system 10. The system 110 is the same as the microelectronic system 10, except that each of the microelectronic elements 140 has an integrated voltage regulator (IVR) 170 therein. Having the microelectronic elements 140 with integrated voltage regulators (IVRs) may provide improved power integrity. Since an IVR input voltage is high (e.g., 5V), the current requirement per pin is much less. Therefore, the power loss from the socket pins 150 may be dramatically reduced.

Each microelectronic element 140 may have an IVR 170 integrated together in a single die or package, or each microelectronic element may be stacked with and electrically connected with an IVR adjacent thereto. The interface between each microelectronic element 140 and adjacent IVR 170 may use conductive masses such as solder balls, or the interface may have direct copper-to-copper bonding between confronting contact elements of the microelectronic element and IVR.

Figure 4:
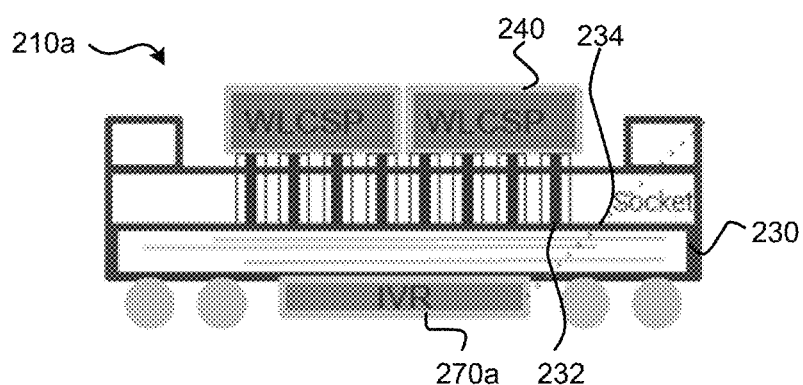
FIG. 4 shows a sectional view of a microelectronic system having a socket thereon, in accordance with aspects of the disclosure.
Figure 5:
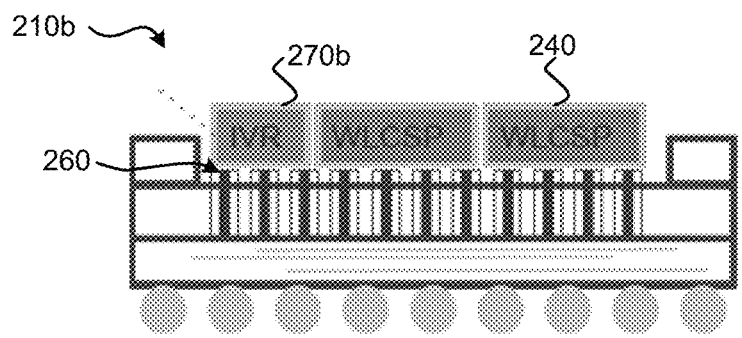
FIG. 5 shows a sectional view of a microelectronic system having a socket thereon, in accordance with aspects of the disclosure.

Now referring to FIGS. 4 and 5, example microelectronic systems 210a and 210b are shown that are variations of the system 110. The systems 210a and 210b are each the same as the microelectronic system 110, except that they include discrete IVR dies 270a and 270b instead of integrated IVR functionality. The system 210a of FIG. 4 has a discrete IVR die 270a that is mounted to some of the conductive pads 232 exposed at the first surface 234 of the substrate 230. The system 210b of FIG. 5 has a discrete IVR die 270b that is mounted to a portion of the LGA 260, adjacent to the microelectronic elements 240.

Figure 6:
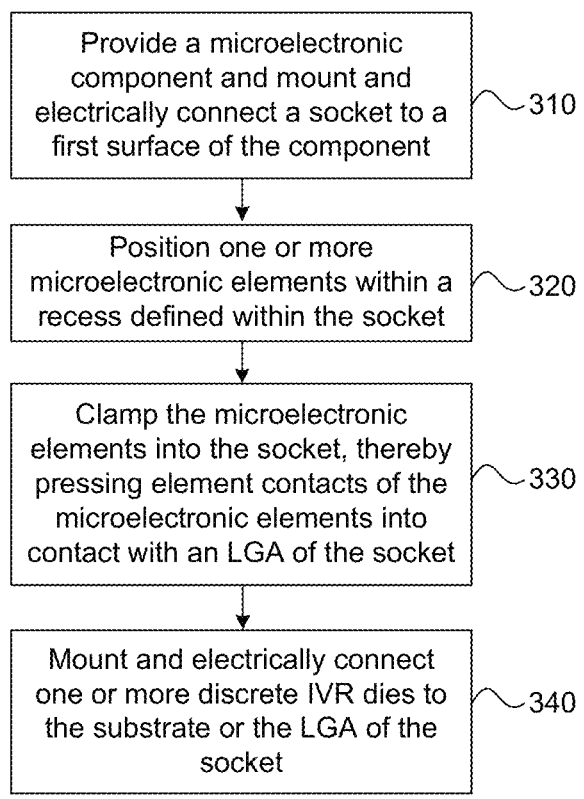
FIG. 6 is a flow chart illustrating an example method in accordance with one aspect of the disclosure.

Now referring to FIG. 6, a method of assembling a microelectronic system will be described. The following operations do not have to be performed in the precise order described below. Rather, various operations can be handled in a different order or simultaneously, and operations may also be added or omitted. FIG. 6 illustrates a flow chart 300 showing an example assembly method for the microelectronic system 10, 110, 210a, or 210b.

In block 310, a microelectronic component 12 may be provided, and a socket 20 may be mounted and electrically connected to the first surface 16 of the microelectronic component. Conductive masses 18 may be used to electrically connect conductive pads 32 exposed at the first surface 34 of the substrate 30 with conductive pads 14 exposed at the first surface 16 of the microelectronic component 12.

In block 320, one or more microelectronic elements 40 may be positioned within a recess 22 defined within the socket 20, such that element contacts 42 of the microelectronic elements contact an LGA 60 comprising either conductive pads 58 or top surfaces of a plurality of socket pins 50. In block 330, the microelectronic elements 40 may be clamped into the socket 20, so that the element contacts 42 of the microelectronic elements are pressed into contact with the LGA 60.

In some examples, (e.g., FIGS. 4 and 5) the method may include block 340, in which one or more of discrete IVR dies 270a may be mounted to some of the conductive pads 232 exposed at the first surface 234 of the substrate 230, or one or more discrete IVR dies 270b may be mounted to a portion of the LGA 260, adjacent to the microelectronic elements 240.

The design of the microelectronic systems 10, 110, 210a, and 210b shown in FIGS. 1-5 are just a few examples of the microelectronic system. Other microelectronic systems are contemplated, such as systems having different numbers of microelectronic elements, IVR dies, and socket pins. For example, the microelectronic systems 10, 110, 210a, and 210b may each include one, two, three, four, six, eight, ten, twelve, sixteen, or thirty-two microelectronic elements, among others.

Although the substrates are shown in the figures as being flip-chip mounted to the microelectronic component 12, 112, and 212, in other examples, the microelectronic component may have bond windows extending therethrough, and the substrates may be wire-bonded to the microelectronic component through the bond windows. Although the bond metals used in FIGS. 1-5 are shown as solder bumps, this need not be the case. In other examples, other electrically conductive bond materials may be used (e.g., a conductive matrix material), or rigid conductive pillars may be used to provide an electrical connection between one or more of the elements and the substrate.

The microelectronic systems 10, 110, 210a, 210b disclosed herein may be used in various electronic systems. For example, the microelectronic component 12, 112, and 212 may be module cards or module substrates that are configured to be mounted to a motherboard of an electronic device such as a personal computer or a cellular phone, among others.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the example implementations should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A microelectronic system, comprising:
   a microelectronic component having electrically conductive elements exposed at a first surface thereof;
   a socket mounted to a first surface of the microelectronic component, the socket including a substrate embedded therein, the socket defining a recess therein, a first surface of the substrate facing the first surface of the microelectronic component;
   one or more microelectronic elements each having active semiconductor devices therein and each having element contacts exposed at a front face thereof, the one or more microelectronic elements being disposed at least partially within the recess of the socket;
   a plurality of socket pins mounted to and extending above a second surface of the substrate, the socket pins being ground shielded coaxial socket pins, each socket pin having an inner pin configured to conduct electrical signals between the substrate and one of the microelectronic elements and an outer shield extending around the inner pin and configured to be electrically connected to a ground potential,
   wherein the socket has a land grid array comprising top surfaces of the plurality of the socket pins or electrically conductive pads mounted to corresponding ones of the socket pins, and the element contacts of the one or more microelectronic elements are pressed into contact with the land grid array.

2. The microelectronic system of claim 1, wherein the socket is mounted to the microelectronic component via ball-grid array connections that include electrically conductive masses extending between electrically conductive pads exposed at the first surface of the substrate and the electrically conductive elements exposed at the first surface of the microelectronic component.

3. The microelectronic system of claim 1, wherein the substrate has electrically conductive wires therein electrically connected to the plurality of socket pins and configured to provide communication between the one or more microelectronic elements.

4. The microelectronic system of claim 1, wherein the one or more microelectronic elements comprises four or more microelectronic elements.

5. The microelectronic system of claim 1, further comprising one or more capacitors disposed within the socket adjacent to one or more of the microelectronic elements.

6. The microelectronic system of claim 1, wherein the one or more microelectronic elements are packaged together in a single wafer-level microelectronic package.

7. The microelectronic system of claim 1, wherein the plurality of socket pins has a minimum pitch between adjacent ones of the socket pins of about 300 microns to 1 mm.

8. The microelectronic system of claim 1, wherein the substrate includes one or more redistribution layers to fan out a smaller minimum pitch between adjacent ones of the socket pins to a larger minimum pitch between adjacent ones of electrically conductive pads exposed at the first surface of the substrate.

9. The microelectronic system of claim 1, wherein each socket pin has an insulator extending between the inner pin and the outer shield thereof, the insulator electrically isolating the inner pin from the outer shield.

10. The microelectronic system of claim 9, wherein the insulator is air.

11. The microelectronic system of claim 1, wherein the socket includes one or more of clamps or alignment guides configured to fix the microelectronic elements within the recess.

12. The microelectronic system of claim 1, wherein an electrical connection between the land grid array and the element contacts of the one or more microelectronic elements is devoid of conductive masses.

13. The microelectronic system of claim 1, wherein each of the one or more microelectronic elements has an integrated voltage regulator therein.

14. The microelectronic system of claim 1, further comprising one or more discrete voltage regulators each mounted to the land grid array or the substrate.

15. A method of assembling a microelectronic system, the method comprising:
   providing a microelectronic component having electrically conductive elements exposed at a first surface thereof;
   mounting a socket to the first surface of the microelectronic component, the socket including a substrate embedded therein, the socket defining a recess therein, a first surface of the substrate facing the first surface of the microelectronic component;
   positioning one or more microelectronic elements at least partially within the recess of the socket, each of the one or more microelectronic elements having active semiconductor devices therein and each having element contacts exposed at a front face thereof;
   clamping the one or more microelectronic elements into the socket, thereby pressing the element contacts of the one or more microelectronic elements into contact with a land grid array of the socket,
   wherein the land grid array of the socket comprises top surfaces of a plurality of socket pins or electrically conductive pads mounted to corresponding ones of the socket pins, the plurality of socket pins mounted to and extending above a second surface of the substrate, the socket pins being ground shielded coaxial socket pins, each socket pin having an inner pin configured to conduct electrical signals between the substrate and one of the microelectronic elements and an outer shield extending around the inner pin and configured to be electrically connected to a ground potential.

16. The method of claim 15, wherein the socket is mounted to the microelectronic component via ball-grid array connections that include electrically conductive masses extending between electrically conductive pads exposed at the first surface of the substrate and the electrically conductive elements exposed at the first surface of the microelectronic component.

17. The method of claim 15, wherein the clamping is performed by one or more of clamps or alignment guides that fix the one or more microelectronic elements within the recess.

18. The method of claim 15, wherein each socket pin has an insulator extending between the inner pin and the outer shield thereof, the insulator electrically isolating the inner pin from the outer shield.

19. The method of claim 15, wherein an electrical connection between the land grid array and the element contacts of the one or more microelectronic elements is devoid of conductive masses.

20. The method of claim 15, wherein each of the one or more microelectronic elements has an integrated voltage regulator therein.

\* \* \* \* \*